United States Patent

Weiss et al.

(10) Patent No.: US 9,685,616 B2
(45) Date of Patent: Jun. 20, 2017

(54) ORGANIC SEMICONDUCTIVE COMPONENT

(71) Applicant: Heliatek GmbH, Dresden (DE)

(72) Inventors: Andre Weiss, Ulm (DE); Dirk Hildebrandt, Neu-Ulm (DE); Olga Gerdes, Ulm (DE); Gunter Mattersteig, Ulm (DE)

(73) Assignee: HELIATEK GMBH, Dresden (DE)

( * ) Notice: Subject to any disclaimer, the term of this patent is extended or adjusted under 35 U.S.C. 154(b) by 0 days.

(21) Appl. No.: 14/899,110

(22) PCT Filed: Jun. 19, 2014

(86) PCT No.: PCT/EP2014/062955
§ 371 (c)(1),
(2) Date: Dec. 16, 2015

(87) PCT Pub. No.: WO2014/206860
PCT Pub. Date: Dec. 31, 2014

(65) Prior Publication Data
US 2016/0141497 A1 May 19, 2016

(30) Foreign Application Priority Data
Jun. 25, 2013 (DE) .................. 10 2013 106 639

(51) Int. Cl.
*H01L 51/00* (2006.01)
*C09B 23/04* (2006.01)
*C09B 57/10* (2006.01)
*H01L 51/05* (2006.01)
*H01L 51/42* (2006.01)

(52) U.S. Cl.
CPC ............ *H01L 51/008* (2013.01); *C09B 23/04* (2013.01); *C09B 57/10* (2013.01); *H01L 51/0046* (2013.01); *H01L 51/0071* (2013.01); *H01L 51/0508* (2013.01); *H01L 51/4253* (2013.01); *H01L 51/4293* (2013.01); *Y02E 10/549* (2013.01)

(58) Field of Classification Search
CPC .................................................... H01L 51/008
See application file for complete search history.

(56) References Cited

U.S. PATENT DOCUMENTS

| | | | |
|---|---|---|---|
| 7,825,326 B2 | 11/2010 | Koppe | |
| 2007/0290195 A1 | 12/2007 | Forrest | |
| 2008/0188660 A1 | 8/2008 | Pschirer et al. | |
| 2009/0176313 A1 | 7/2009 | Suzuki et al. | |
| 2010/0231125 A1 | 9/2010 | Li et al. | |
| 2011/0042651 A1 | 2/2011 | Koenemann et al. | |
| 2013/0104968 A1 | 5/2013 | Pfeiffer et al. | |

FOREIGN PATENT DOCUMENTS

| | | |
|---|---|---|
| EP | 2 385 556 A1 | 11/2011 |
| EP | 2 693 504 A1 | 2/2014 |
| JP | 2008 109091 A | 5/2008 |
| JP | 2008-109097 A | 5/2008 |
| JP | 2009-505440 A | 2/2009 |
| WO | 2006/111511 A1 | 10/2006 |
| WO | 2007/116001 A2 | 10/2007 |
| WO | 2007/126052 A1 | 11/2007 |
| WO | 2008/145172 A1 | 12/2008 |
| WO | 2012/132447 A1 | 10/2012 |
| WO | 2013/066453 A1 | 5/2013 |
| WO | 2014/025435 A2 | 2/2014 |

OTHER PUBLICATIONS

Lunt et al., "Transparent, near-infrared organic photovoltaic solar cells for window and energy-scavenging applications", Applied Physics Letters, Mar. 17, 2011, pp. 113305, vol. 98-11, American Institute of Physics, US.
International Search Report for International Application No. PCT/EP2014/062955, dated Sep. 19, 2014.
Office Action issued in corresponding Australian patent application No. 2014301318 dated Jul. 13, 2016.
Examination Report issued in corresponding Japanese Patent Application No. 2016-522406.

*Primary Examiner* — Shawquia Jackson
(74) *Attorney, Agent, or Firm* — Heslin Rothenberg Farley & Mesiti, P.C.

(57) ABSTRACT

A semiconductive component with a layer system includes at least one layer comprising a compound of the general formula (I) or (II).

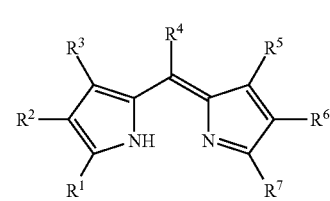

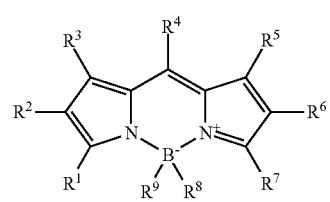

15 Claims, 2 Drawing Sheets

ORGANIC SEMICONDUCTIVE COMPONENT

CROSS REFERENCE TO RELATED APPLICATIONS

This application is a national stage filing under section 371 of International Application No. PCT/EP2014/062955, filed on Jun. 19, 2014, and published in German on Dec. 31, 2014, as WO 2014/206860 A1 and claims priority of German application 10 2013 106 639.9 filed on Jun. 25, 2013, the entire disclosure of these applications being hereby incorporated herein by reference.

BACKGROUND ART

The present invention relates to an organic electronic component comprising at least one organic layer between two electrodes, wherein the organic layer comprises at least one compound from the group of the BODIPYs proposed.

It is assumed that organic semiconductors based on low molecular weight or polymeric compounds will find increasing uses in many fields of the electrical industry. The advantages of organic chemistry are beneficial here, such as less energy-intensive processibility, better substrate compatibility and greater possible variation. Examples of organic electronics aside from general electronic circuits are OLEDs, OPVs, photodetectors and OFETs.

Organic electronic materials are usually divided into dopants and independent semiconductors. Dopants alter the electrical properties of a matrix layer when they are applied together therewith (for example coevaporated), but they need not be semiconductors themselves. The organic semiconductor materials, in contrast, are already semiconductive on their own. Organic semiconductors can fulfill various functions in an electronic component, for example charge transport, radiation absorption or radiation emission, it being possible for one or more functions to be fulfilled simultaneously.

Also additionally known are solar cells having organic active layers and a flexible configuration (Konarka—Power Plastic Series). The organic active layers may be formed from polymers (e.g. U.S. Pat. No. 7,825,326 B2) or small molecules (e.g. EP 2385556 A1). While it is a feature of polymers that they are not evaporable and can therefore only be applied from solutions, small molecules are evaporable.

The advantage of such organic-based components over the conventional inorganic-based components (semiconductors such as silicon, gallium arsenide) are the optical absorption coefficients, which are extremely high in some cases (up to $2 \times 10^5$ cm$^{-1}$), and so it is possible to produce very thin solar cells with low material and energy expenditure. Further technological aspects are the low costs, the possibility of producing flexible large-area components on plastic films, and the virtually unlimited possible variations and unlimited availability of organic chemistry.

Organic solar cells consist of a sequence of thin layers (typically each of 1 nm to 1 μm in thickness) of organic materials which are preferably applied by vapor deposition under reduced pressure or spun on from a solution. Electrical contacts can be formed by metal layers, transparent conductive oxides (TCOs) and/or transparent conductive polymers (PEDOT-PSS, PANI).

A solar cell converts light energy to electrical energy. In this context, the term "photoactive" is understood to mean the conversion of light energy to electrical energy. In contrast to inorganic solar cells, the light does not directly generate free charge carriers in organic solar cells; instead, excitons are first formed, i.e. electrically uncharged excited states (bound electron-hole pairs). Only in a second step are these excitons separated into free charge carriers, which then contribute to electrical current flow.

In multiple solar cells, the individual stacked cells are usually connected in series, and so the cell that produces the lowest current limits the entire system. In order to be able to exploit the full solar spectrum, in contrast, several compounds are needed, which absorb at different wavelengths and can be combined in terms of energy.

Particularly for the field of nonpolymeric compounds, there are currently only few known IR absorbers in the range of 650-1400 nm for use in organic optoelectronics. IR absorbers are of particular interest since they absorb in the invisible region of light and therefore appear transparent to the human observer or, in combination with colored absorbers, can utilize a broader range of the solar spectrum.

WO 2006/111511 describes hexaarylene- and pentaarylenetetra-carboximides as active components in photovoltaics. WO2007/116001 relates to rylenetetracarboxylic acid derivatives and to the use thereof as organic n-type semiconductors for production of organic field-effect transistors and of solar cells. WO 2008/145172 relates to substituted carboxyphthalocyanines and to the use thereof as active component in photovoltaics.

WO2007/126052 describes a fluorescent compound based on a BODIPY base skeleton and use of the compounds described as fluorescent dyes. There is no description of the use of the BODIPYs described as a constituent in absorber or transport layers in semiconductive or optoelectronic components.

The IR dyes known from the prior art are not entirely satisfactory. For example, processibility is inadequate, they do not have thermal stability for evaporation under reduced pressure, they do not have satisfactory absorption intensity in thin layers (for example because of unsuitable preferential orientation in layer growth or too low a molar extinction coefficient), photostability is too low, they do not have adequate transport properties for utilization of radiation absorbed or they do not have a good energetic fit into the component.

BRIEF SUMMARY OF THE INVENTION

The object is thus that of providing IR absorbers which can be utilized in organic electronics and overcome the aforementioned disadvantages.

According to the invention, a semiconductive component comprises at least one layer in a layer system a compound of the general formula I or II

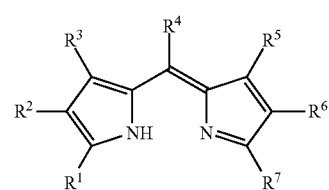

I

-continued

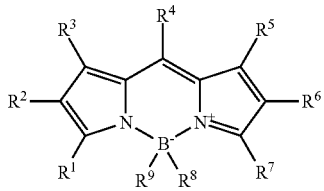

II where
R1 and R2 and/or R6 and R7, in each case together, form a heterocyclic 5-membered ring or 6-membered ring having at least one heteroatom selected from S, O, N and P, or a homocyclic 6-membered ring having no further fusion, and R1 and R2 or R6 and R7 are independently an H or another radical if they do not form a heterocyclic or homocyclic radical, R3, R4 and R5 are independently H or a radical selected from aryl, alkyl, fluorinated or partly fluorinated alkyl, unsaturated alkyl and R8 and R9 are independently selected from halogen, alkyl, fluorinated or partly fluorinated alkyl, alkenyl, alkynyl, alkoxy, aryl or heteroaryl.

In one embodiment of the invention, a semiconductive component comprises at least one layer in a layer system a compound of the general formula II

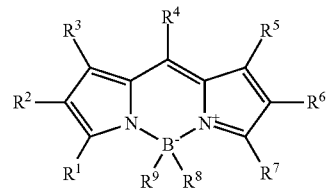

where R1 and R2 and/or R6 and R7, in each case together, form a heterocyclic 5-membered ring or 6-membered ring having at least one heteroatom selected from S, O, N and P, or a homocyclic 6-membered ring having no further fusion, and R1 and R2 or R6 and R7 are independently an oxygen or another radical if they do not form a heterocyclic or homocyclic radical, R3, R4 and R5 are independently H or a radical selected from aryl, alkyl, fluorinated alkyl, unsaturated alkyl and R8 and R9 are independently selected from halogen, alkyl, alkenyl, alkynyl, alkoxy, aryl or heteroaryl.

In one embodiment of the invention, in the compound of the general formula I or II, R1 and R2 and/or R6 and R7, in each case together, form a heterocyclic 5-membered ring or 6-membered ring having at least one heteroatom selected from S, O, N or P.

In one embodiment of the invention, both R1 and R2 and R6 and R7, in each case together, form a heterocyclic 5-membered ring or 6-membered ring having at least one heteroatom selected from S, O, N or P.

In one embodiment of the invention, both R1 and R2 and R6 and R7, in each case together, form a homocyclic 6-membered ring having no further fusion. "No further fusion" in this connection means that, apart from the connection sites to R1 and R2 and/or R6 and R7, no further pair of radical forms any further homocyclic or heterocyclic ring.

Preferably, at least three of the four remaining bonding sites on the homocyclic ring remain unsubstituted.

In one embodiment of the invention, R4 is selected from aryl, alkyl, fluorinated or partly fluorinated alkyl or unsaturated alkyl, but R4 is preferably a fluorinated or partly fluorinated alkyl.

In one embodiment of the invention, the compound of the general formula I is between 300 and 1500 g/mol in size.

In one embodiment of the invention, the heterocyclic 5-membered ring or 6-membered ring formed by R1 and R2 and/or R6 and R7 is selected from one of the formulae that follow. If both R1 and R2 and R6 and R7 form a ring, the two rings may be the same or different.

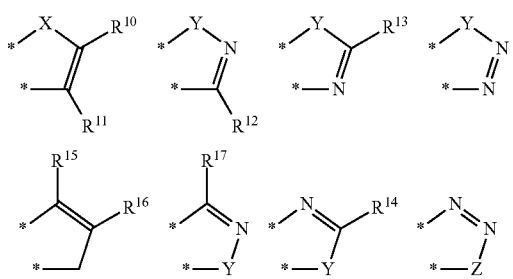

The parts of the above formulae identified by * represent the bonding site to R1, R2, R6 or R7 of general formula I or II. X, Y and Z are each independently selected from O, S, Se and N—R18 with R18 selected from H and alkyl, and R10 to R17 are each independently selected from H, alkyl, alkynyl, alkenyl, O-alkyl, S-alkyl, aryl, heteroaryl, halogenated alkyl, cyanated alkyl.

In one embodiment of the invention, the homocyclic 6-membered ring which is formed by R1 and R2 and/or R6 and R7 and has no further fusion is selected from a compound of the formula that follows. If both R1 and R2 and R6 and R7 form a ring, the two rings may be the same or different.

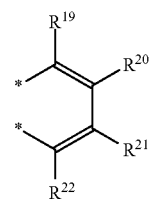

The parts of the above formulae identified by * represent the bonding site to R1, R2, R6 or R7 of general formula I or II. R19 to R22 are each independently selected from H, alkyl, alkynyl, alkenyl, O-alkyl, S-alkyl, aryl, heteroaryl, halogenated alkyl, cyanated alkyl.

In one embodiment of the invention, an aryl or aryl radical, at R10 to R17 or R19 to R22, has a further radical that increases the donor character of the aryl or heteroaryl, preferably alkyl, O-alkyl, N(alkyl)$_2$ or N-cycloalkyl.

Preferred inventive compounds of the general formula (I) are shown below:

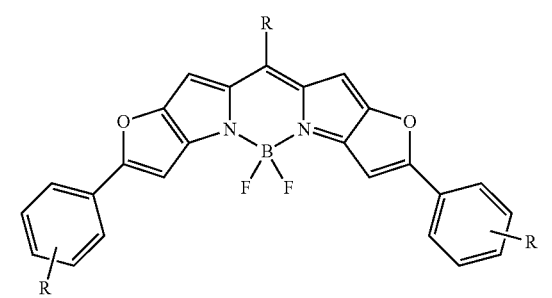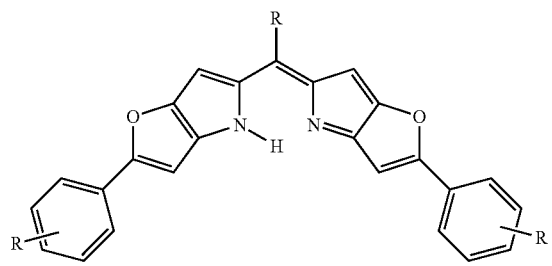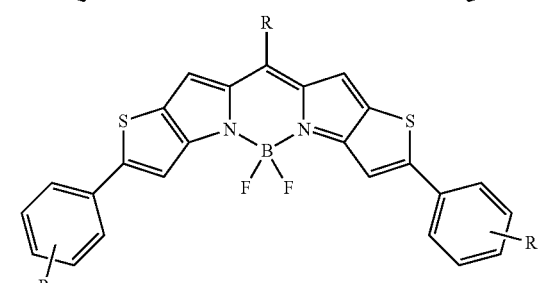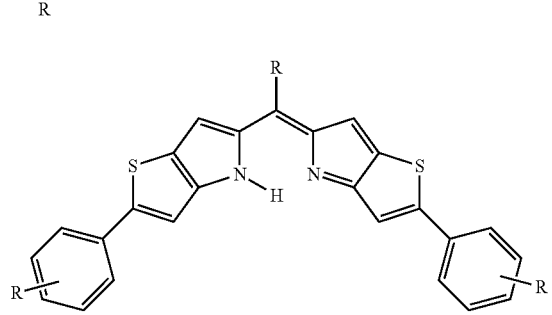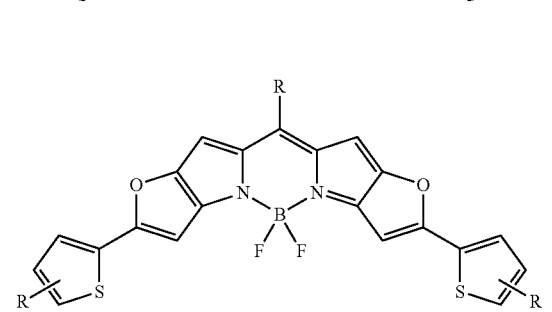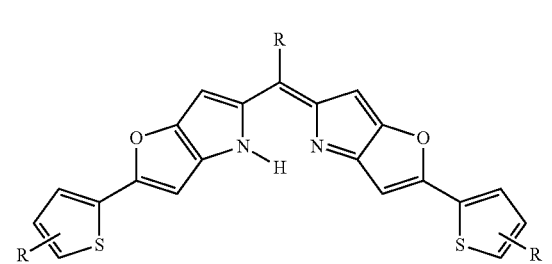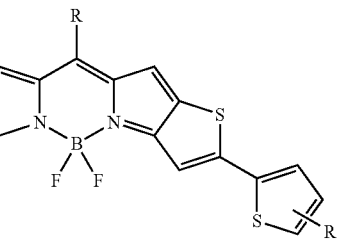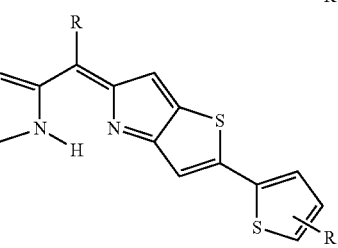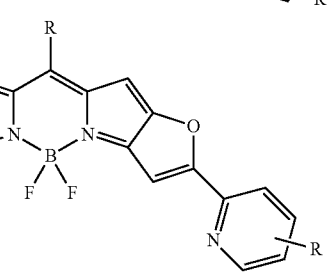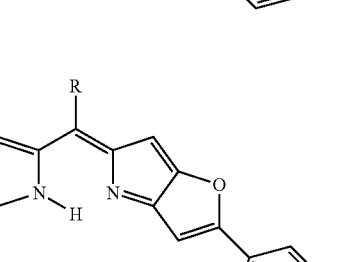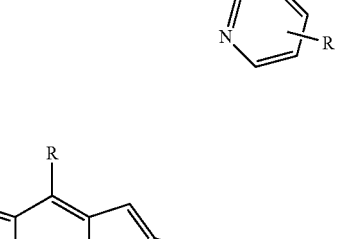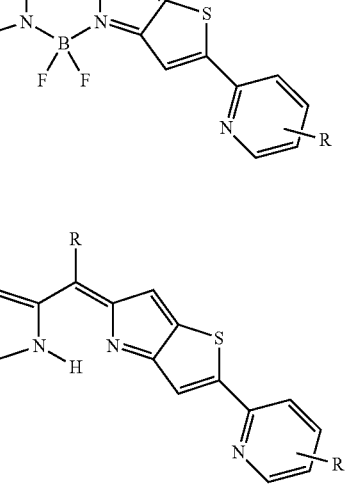

-continued
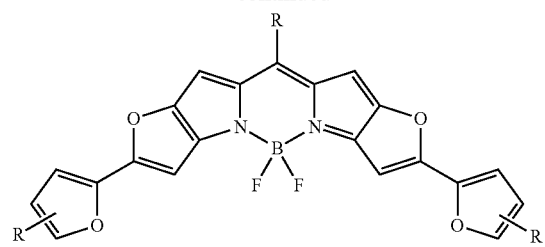
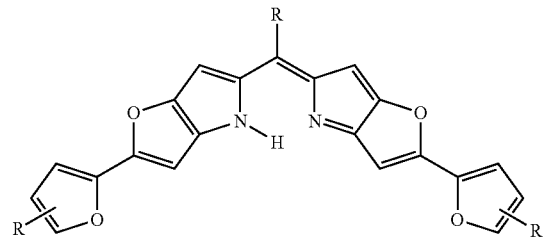
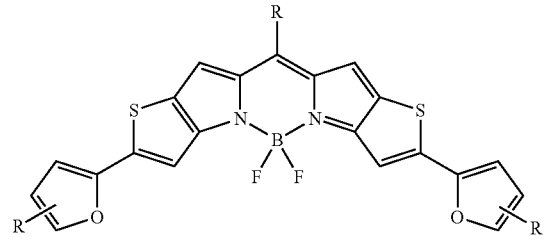
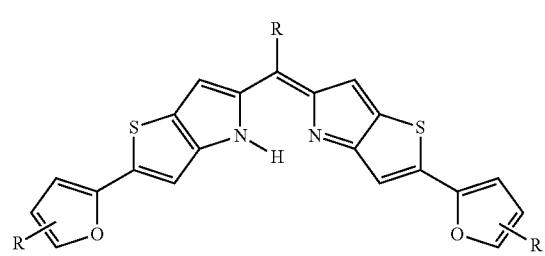
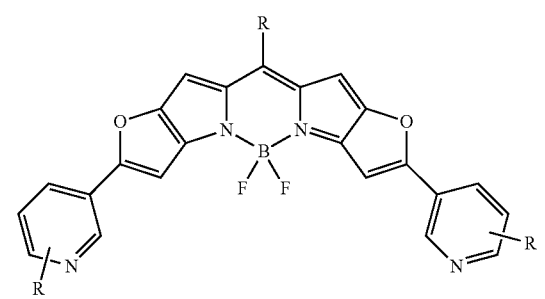
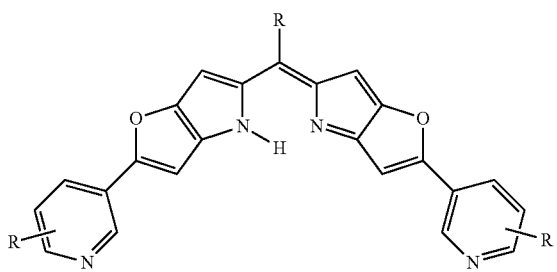
-continued
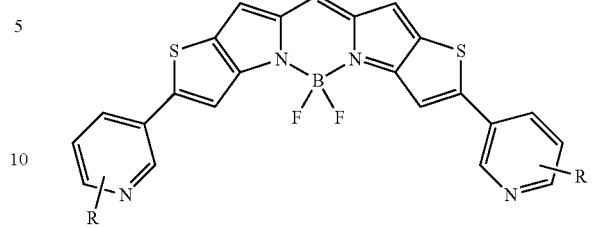
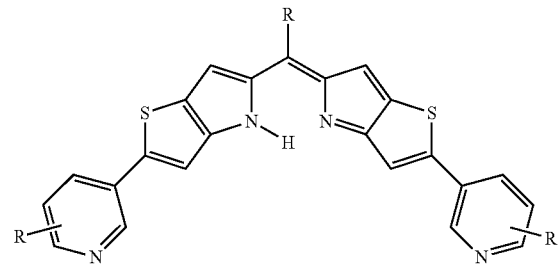
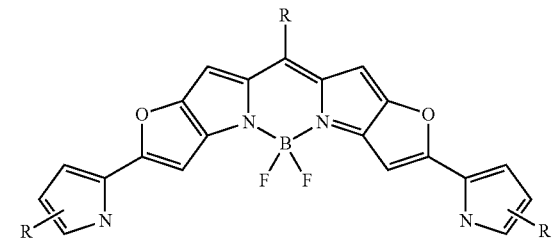
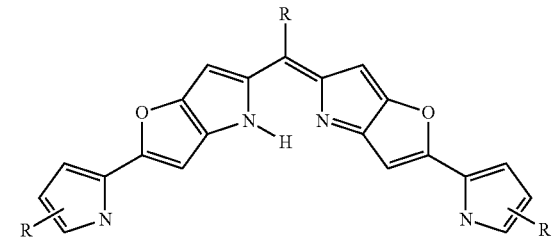
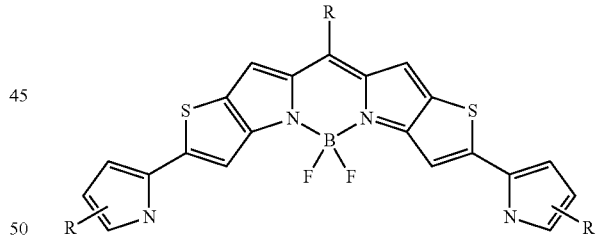
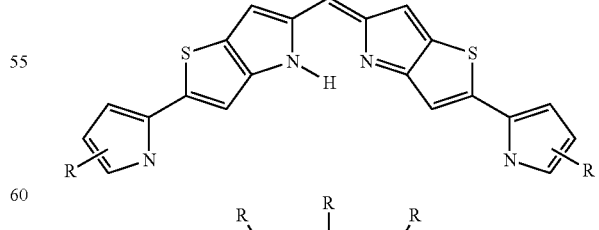

-continued
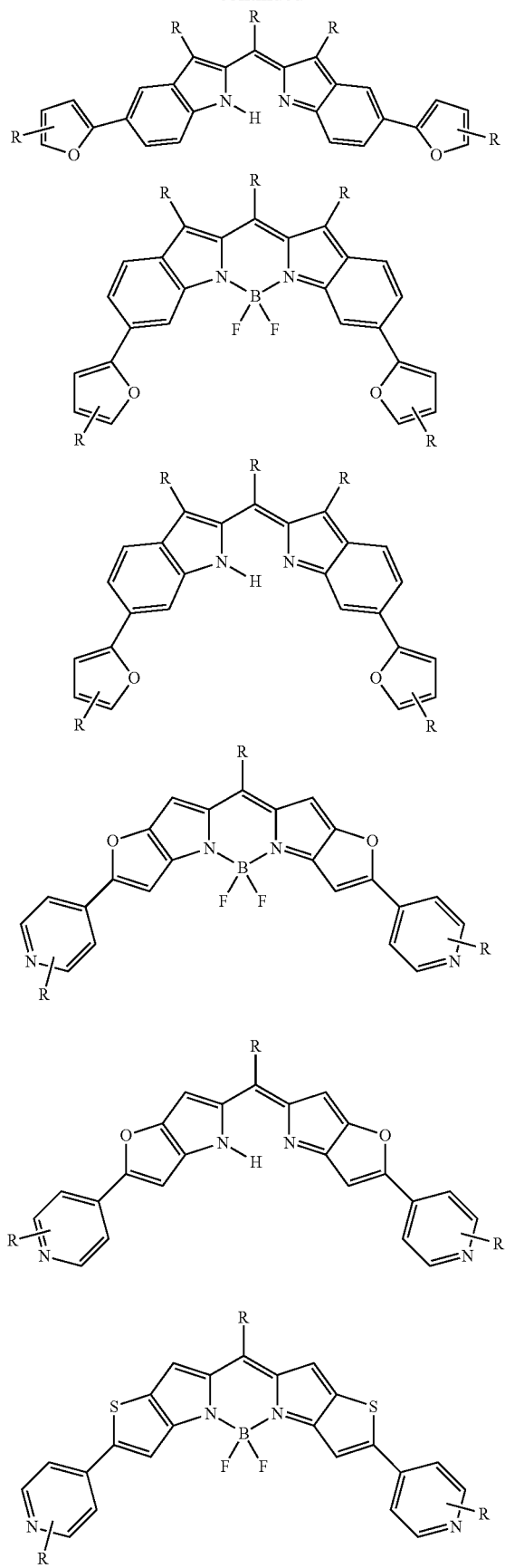
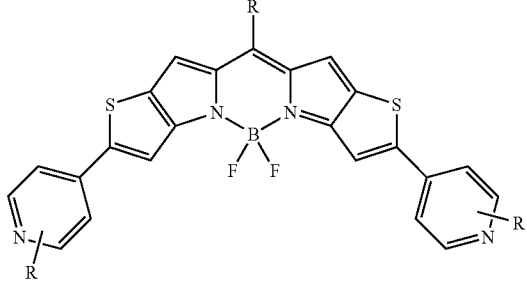
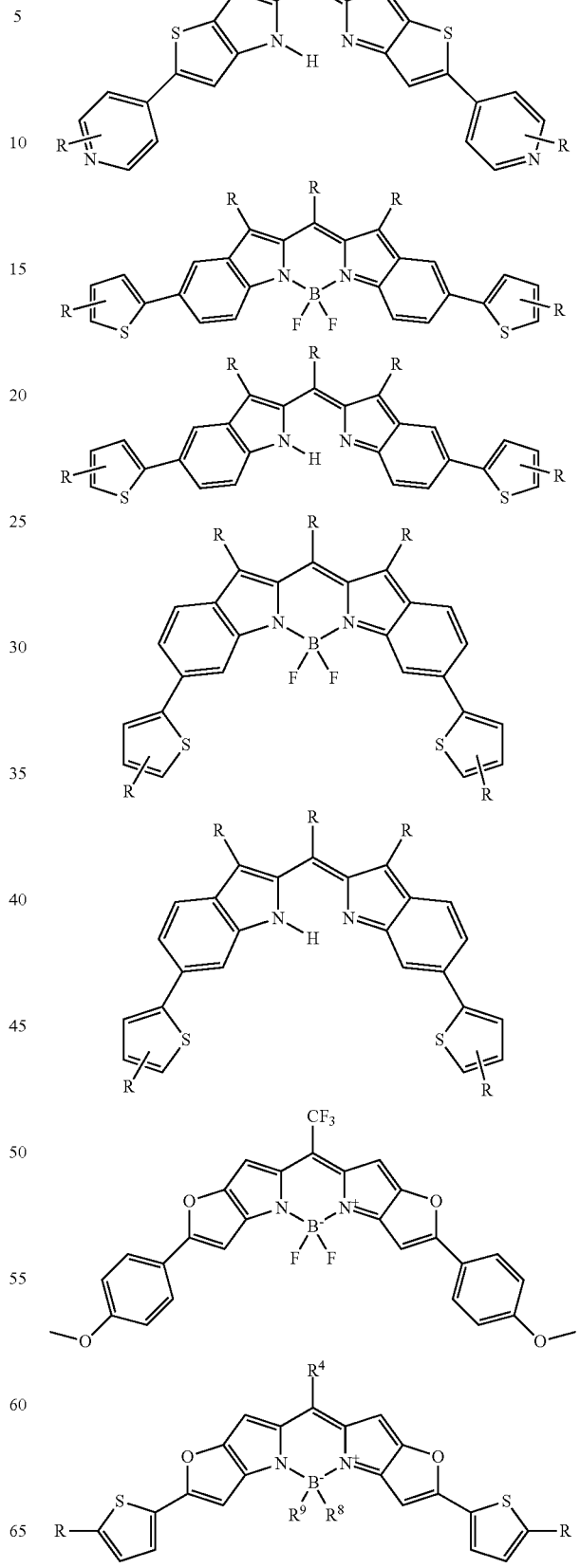
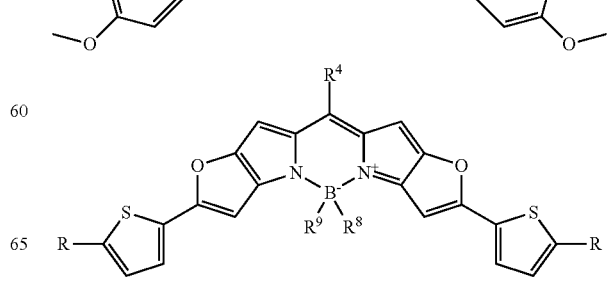

-continued
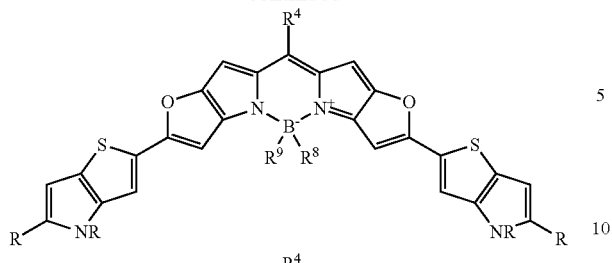
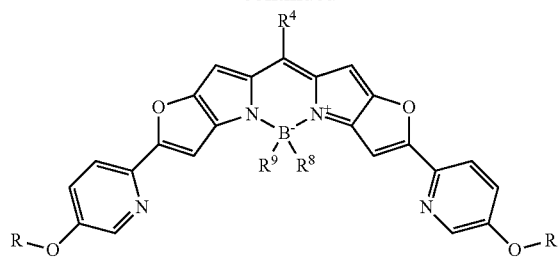
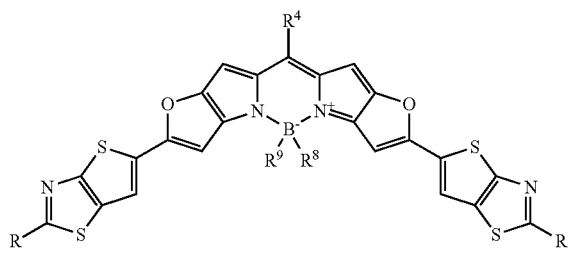
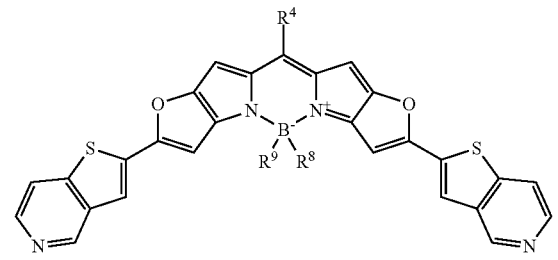
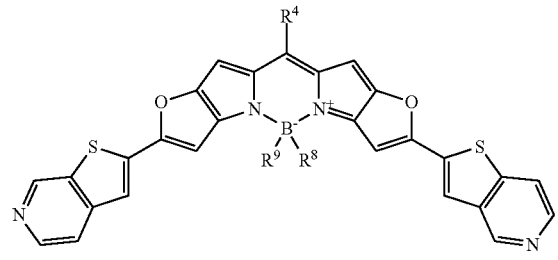
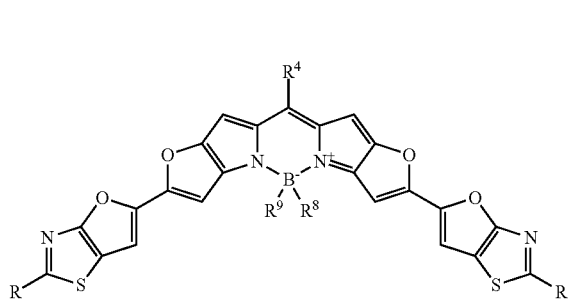
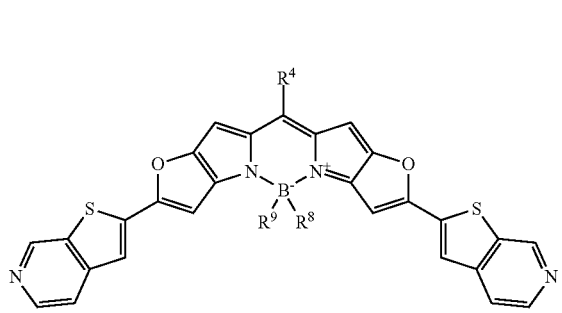
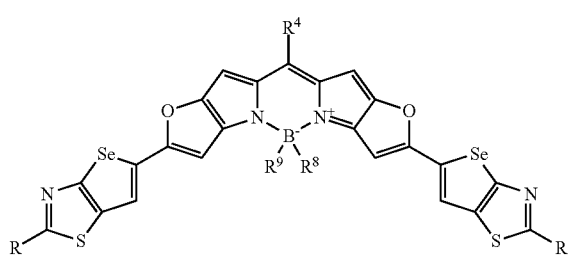
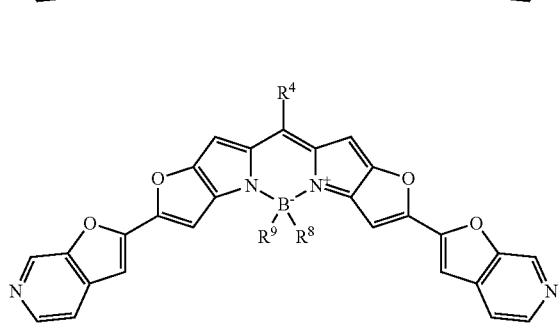
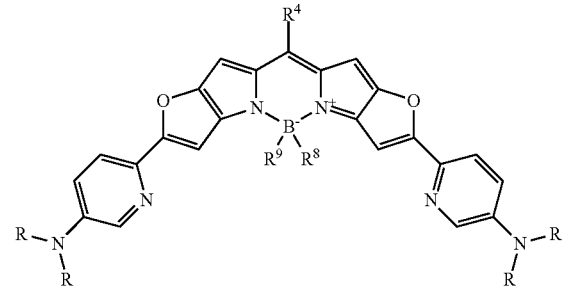
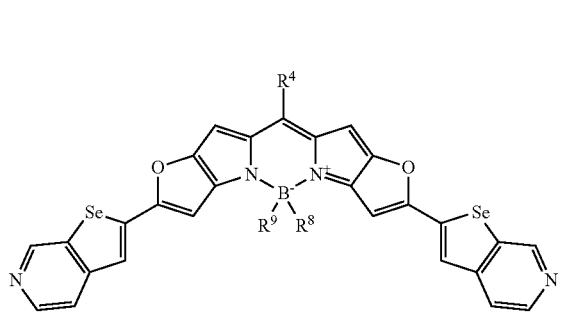

-continued

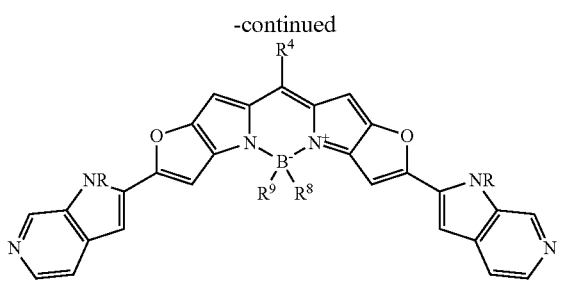

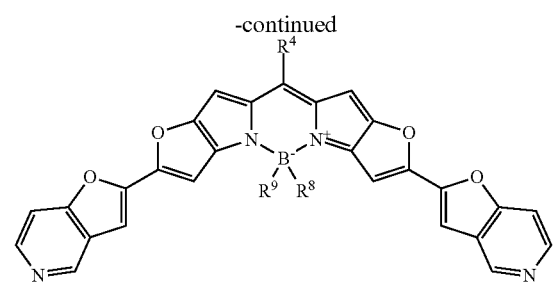

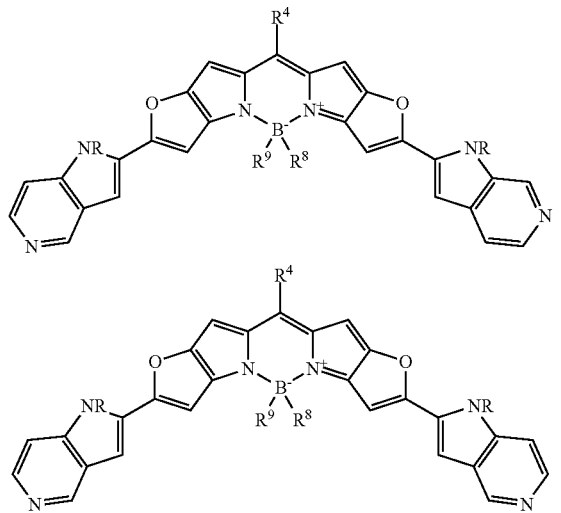

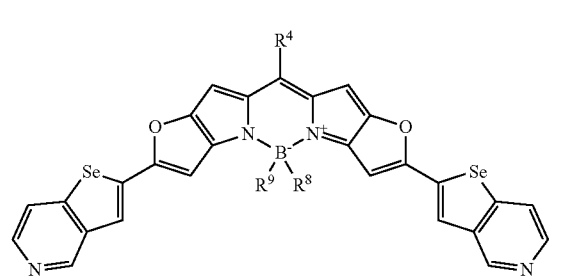

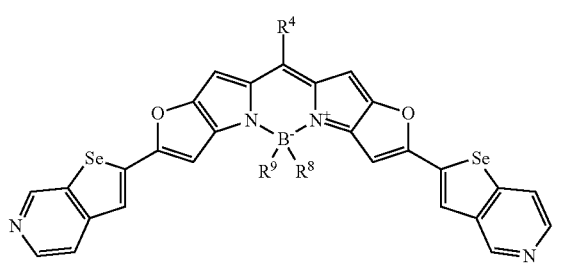

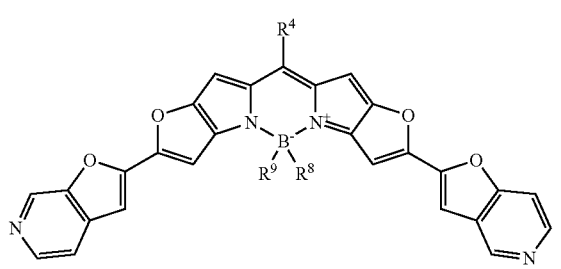

The inventive compounds of the general formula I or II absorb red and near-infrared light within a wavelength range from 600 to 900 nm. It has been found that, astonishingly, they additionally have adequate transport properties to be usable in semiconductive components. For instance, in terms of energy, they can be fitted by slight variations into the layer system of the component. It is thus possible to produce semiconductive components that appear substantially transparent to the human eye and, in combination with other absorbent materials, tandem solar cells having improved efficiency.

In general, the compounds of the general formula I or II are thermally stable up to more than 300° C. and can be processed without decomposition by thermal evaporation under reduced pressure to give layers. In addition, it is possible with the inventive compounds to transfer the energy absorbed at a heterojunction with molecules having acceptor character (e.g. fullerene C60) to free charge carrier pairs and ultimately convert it to electrical energy and utilize it.

In one embodiment of the invention, the semiconductive component is an optoelectronic component, for example a solar cell, an (optionally light-sensitive) OFET or a photodetector. Optoelectronics are understood in the broadest sense to mean components which can convert incident light to electrical energy or electrical current or voltage signals, or electrical energy to light emission.

In one embodiment of the invention, the semiconductive component is a photoactive component, preferably a solar cell.

In one embodiment of the invention, the semiconductive component is a solar cell or a photodetector and an inventive compound according to the general formula I or II is used as absorbing material in a light absorber layer system.

In one embodiment of the invention, the compound according to general formula I or II is used as donor in a donor-acceptor heterojunction.

The photoactive region contains at least one organic donor material in contact with at least one organic acceptor material, where the donor material and the acceptor material form a donor-acceptor heterojunction and where the photoactive region includes at least one compound of the formula I or II.

Suitable acceptor materials are preferably selected from the group of the fullerenes and fullerene derivatives, the polycyclic aromatic hydrocarbons and derivatives thereof, especially naphthalene and derivatives thereof, rylenes, especially perylene, terrylene and quaterrylene, and derivatives thereof, acenes, especially anthracene, tetracene, in particular rubrene, pentacene and derivatives thereof, pyrene and derivative thereof, the quinones, quinonedimethanes and derivatives thereof, the phthalocyanines and subphthalocyanines and derivatives thereof, the porphyrins, tetraazaporphyrins, tetrabenzoporphyrins and derivatives thereof, the thiophenes, oligothiophenes, fused thiophenes such as thienothiophene and bithienothiophene, and derivatives thereof, the thiadiazoles and derivatives thereof, the carbazoles and triarylamines and derivatives thereof, the indanthrones, violanthrones and flavanthrones and derivatives thereof.

In one embodiment of the invention, the semiconductive component contains one or more transport layers which may be doped, partly doped or undoped. A transport layer system is understood to mean layers composed of one or more plies which transport one kind of charge carriers and preferably themselves absorb electromagnetic radiation only within a range of <450 nm.

Doping is understood to mean the addition of a dopant leading to an increase in the density of free charge carriers, electrons for n-doping and holes for p-doping. Dopants are compounds which alter the electrical properties of the matrix material without necessarily themselves being semiconductive. In general, dopant concentrations are between 1% and 30%.

One possible implementation of an organic solar cell which has already been proposed in the literature is that of a pin diode having the following layer structure:
0. carrier, substrate,
1. base contact, usually transparent,
2. p layer(s),
3. i layer(s),
4. n layer(s),
5. top contact.

In this context, n and p mean n- and p-doping respectively, which leads to an increase in the density of free electrons or holes in the thermal equilibrium state. In this context, layers of this kind should be regarded primarily as transport layers. The term "i-layer", in contrast, refers to an undoped layer (intrinsic layer). One or more i layer(s) may consist here of layers either of one material or of a mixture of two or more materials (called interpenetrating networks).

In one embodiment of the invention, the n layer and/or p layer consists of a sequence of doped or undoped layers.

In one embodiment of the invention, the i layer of the semiconductive component takes the form of a mixed layer. This can be achieved, for example, by coevaporation of two or more materials. In a heterojunction, one material in the layer system functions as a donor and the other material as an acceptor for electrons. The excitons produced are separated at the boundary layer. The advantage of a mixed layer over a flat heterojunction in which donor and acceptor are present as two adjoining layers is that the excitons only have to cover a small distance to the next boundary layer.

In one embodiment of the invention, the absorber layer system of the semiconductive component takes the form of a mixed layer with an adjoining individual layer.

In one embodiment of the invention, an n layer disposed between the base contact and the p layer and/or between the p layer and the i layer.

In one embodiment of the invention, a p layer disposed between the top contact and the n layer and/or between the n layer and the i layer.

In one embodiment of the invention, the layer sequence is inverted and the system is an nip system.

In one embodiment of the invention, the thickness of one or more transport layers as so-called spacer layers is chosen such that the absorbing i layers can be positioned at the site of the optical maximum of the incident radiation. It is thus possible to increase the efficiency of the component.

In one embodiment of the invention, one or more conversion contacts is between the individual cells of a tandem or multiple cell component.

In one embodiment of the invention, the component of the invention is a tandem or multiple cell, with two or more cells stacked and connected in series. In this case, the i layers of the individual cells are formed from identical or different materials or material mixtures.

In one embodiment of the invention, the semiconductive component has been applied to a flexible substrate.

In the context of the present invention, a flexible substrate is understood to mean a substrate which ensures deformability as a result of application of external force. As a result, such flexible substrates are suitable for arrangement on curved surfaces. Flexible substrates are, for example, films or metal ribbons.

In a further embodiment of the invention, the electrode disposed on the substrate is opaque or transparent.

In a further embodiment of the invention, both electrodes are transparent.

The compounds of the general formula I or II can be prepared as described in WO2007/126052.

The production of the individual layers of a component of the invention can be accomplished by evaporation under reduced pressure, with or without carrier gas, or processing of a solution or suspension as, for example, in coating or printing. Individual layers can likewise be applied by sputtering. This is possible for the base contact in particular. The production of the layers by evaporation under reduced pressure is advantageous, in which case the carrier substrate can be heated. It has been found that, astonishingly, the inventive compounds according to formula I or II, when the substrate temperature is increased up to more than 100° C. during the layer growth, can be processed to give well-functioning semiconductive components having strongly absorbing absorber layers. This means that they do not tend to excessive crystallization and hence to the formation of excessively rough layers. Nor is any great decrease in absorption resulting from unsuitable preferential orientation (molecules whose transition dipole moment is virtually at right angles to the substrate) observed in the case of growth on heated substrate. In spite of this, when the substrate temperature is increased during the layer growth, especially for photoactive mixed layers comprising fullerene C60, an improvement in transport properties resulting from improved order and hence an increase in the fill factor of solar cells is observed.

An unfavorable preferential orientation with preferentially "upright" molecular transition dipoles is frequently observed for oligomers such as oligothiophenes, terminally alkylated oligothiophenes or oligoaryls, and such compounds are thus unsuitable for use in solar cells since they interact only weakly with the incident light.

The embodiments can be combined with one another.

BRIEF DESCRIPTION OF THE DRAWING FIGURES

The invention is to be elucidated in detail hereinafter with reference to some working examples and figures. The working examples are intended to describe the invention without restricting it. The figures show:

FIG. 1 a schematic diagram of a semiconductive component,

FIG. 2 a graph of an absorption spectrum of an inventive compound of the general formula II, FIG. 3 a graph of a spectral external quantum yield of an inventive compound of the general formula II in a semiconductive component and FIG. 4 a graph of the fill factor and the efficiency of an MIP component at different substrate temperatures.

DETAILED DESCRIPTION

Working Example

Compound (1)

In one working example, an MIP component consisting of a sample on glass with a transparent ITO base contact (M), a layer of fullerene $C_{60}$ (I), a 1:1 mixed layer of compound 1 with fullerene $C_{60}$ (I), a p-doped hole transport layer composed of Di-NPB and NDP9 and a top contact of gold is produced, the mixed layer of compound 1 and $C_{60}$ having been deposited at a substrate temperature of 110° C.

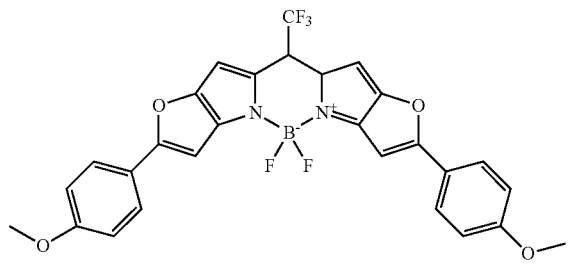

Working Example 2

Figure 1:
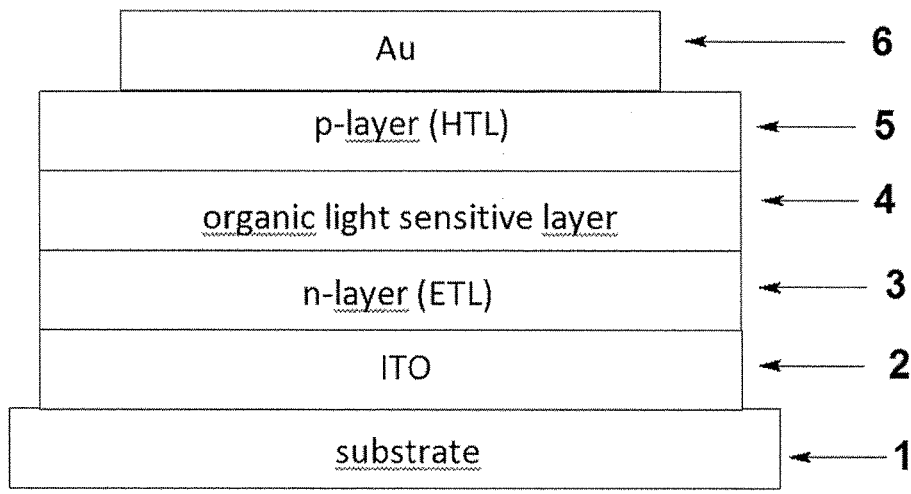
Figure 2:
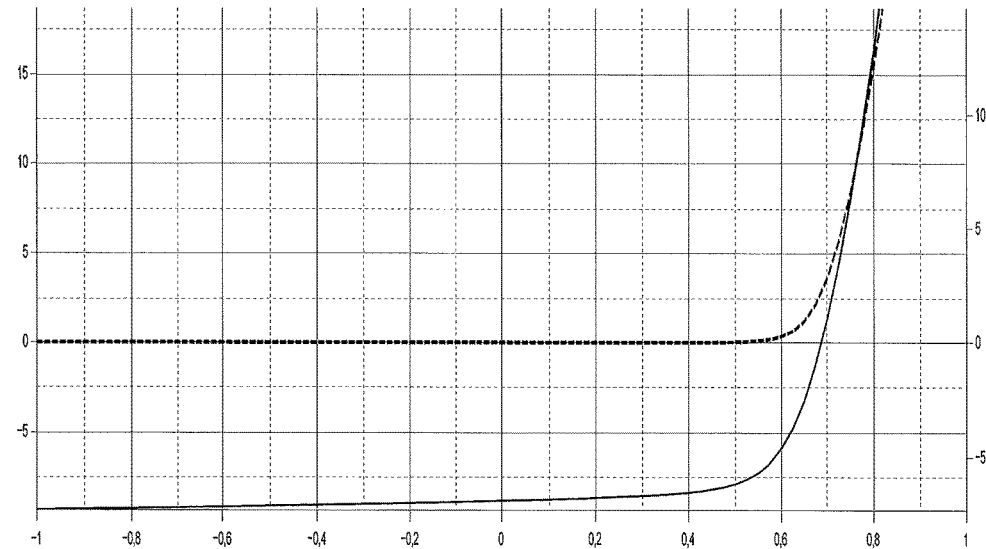
FIG. 2 shows the current-voltage curve of this component. The most important parameters are the fill factor FF of 66%, the open-circuit voltage UOC of 0.69 V and the short-circuit current jSC of 9.2 mA, and show a well-functioning solar cell.
Figure 3:
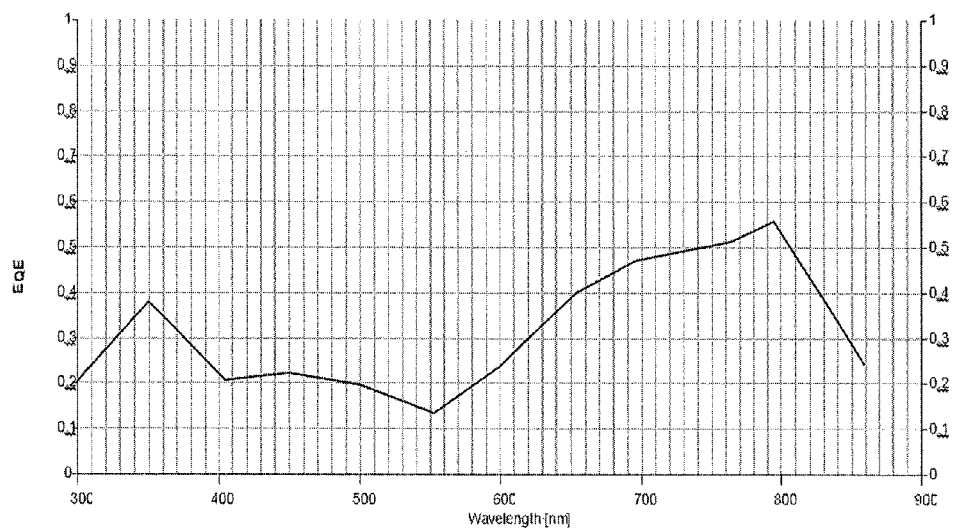
FIG. 3 shows the the diagram of the spectral external quantum yield, which is defined as the number of electrons $cond_{60}$ and compound 1 are photoactive.
Figure 4:
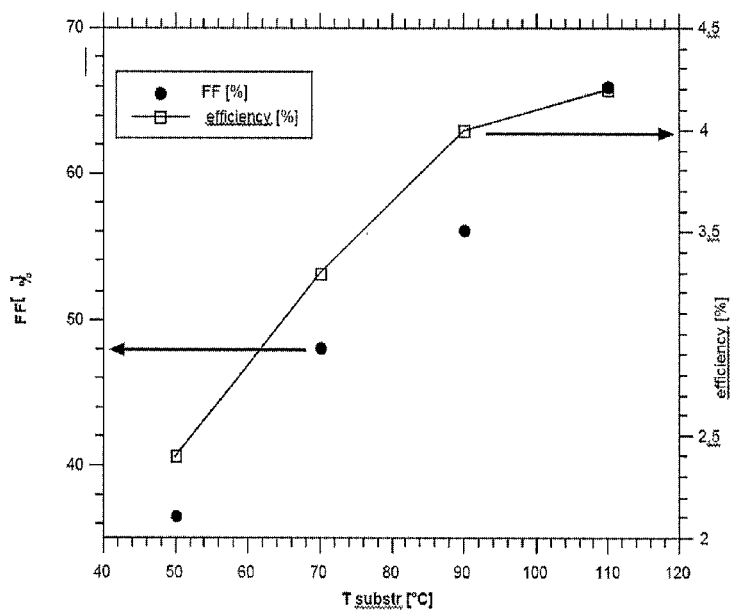

One MIP each as described in example 1 was produced at the following different substrate temperatures: 50° C., 70° C., 90° C. and 110° C. It can be seen from the graph in FIG. 4 that the fill factor and efficiency likewise rise with rising substrate temperature.

The invention claimed is:

1. A semiconductive component having a layer system wherein at least one layer comprises a compound of formula I or II

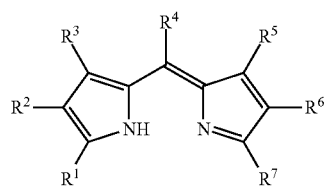

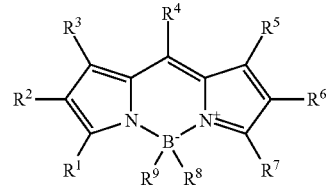

where:
R1 and R2 and/or R6 and R7, in each case together, form a heterocyclic 5-membered ring or 6-membered ring having at least one heteroatom selected from S, O, N and P, or a homocyclic 6-membered ring having no further fusion, and R1 and R2 or R6 and R7 are independently an H or another radical if they do not form a heterocyclic or homocyclic ring, R3, R4 and R5 are independently H or a radical selected from aryl, alkyl, fluorinated or partly fluorinated alkyl, unsaturated alkyl, and R8 and R9 are independently selected from halogen, alkyl, fluorinated or partly fluorinated alkyl, alkenyl, alkynyl, alkoxy, aryl or heteroaryl.

2. The semiconductive component as claimed in claim 1, where R1 and R2 and/or R6 and R7, in each case together, form a heterocyclic 5-membered ring or 6-membered ring having at least one heteroatom selected from S, O, N and P.

3. The semiconductive component as claimed in claim 1, where R1 and R2 and R6 and R7, in each case together, form a heterocyclic 5-membered ring or 6-membered ring having at least one heteroatom selected from S, O, N and P.

4. The semiconductive component as claimed in claim 1, where R4 is selected from aryl, alkyl, fluorinated or partly fluorinated alkyl or unsaturated alkyl.

5. The semiconductive component as claimed in claim 1, wherein the compound has a molar mass of 300-1500 g/mol.

6. The semiconductive component as claimed in claim 1, wherein the component comprises an optoelectronic component.

7. The semiconductive component as claimed in claim 1, wherein the layer comprising at least one compound of the general formula I or II is a light-absorbing layer.

8. The semiconductive component as claimed in claim 1, wherein at least one doped, partly doped or undoped charge carrier transport layer is present in the layer system as well as the layer comprising at least one compound of the general formula I or II.

9. The semiconductive component as claimed in claim 7, wherein the light-absorbing layer is configured as a mixed layer composed of at least two different compounds with or without additional adjoining individual layer or as a double mixed layer or as a triple mixed layer.

10. The semiconductive component as claimed in claim 1, wherein the component is configured as a tandem cell or multiple cell.

11. The semiconductive component as claimed in claim 1, wherein the component is transparent or partly transparent, the component being transparent or partly transparent within a spectral range visible to the human eye.

12. A method of fabricating a semiconductive element comprising:
use of a compound of formula I or II

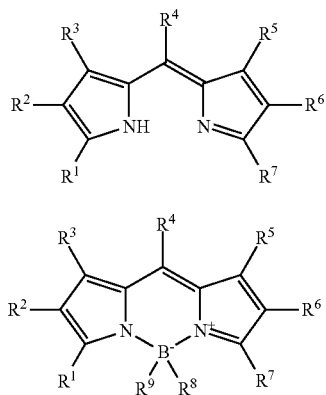

where:
R1 and R2 and/or R6 and R7, in each case together, form a heterocyclic 5-membered ring or 6-membered ring having at least one heteroatom selected from S, O, N and P, or a homocyclic 6-membered ring having no further fusion, and R1 and R2 or R6 and R7 are independently an H or another radical if they do not form a heterocyclic or homocyclic radical,
R3, R4 and R5 are independently H or a radical selected from aryl, alkyl, fluorinated or partly fluorinated alkyl, unsaturated alkyl, and
R8 and R9 are independently selected from halogen, alkyl, alkenyl, alkynyl, alkoxy, aryl or heteroaryl.

13. The method as claimed in claim 12, wherein the semiconductive element comprises a solar cell.

14. The semiconductive component as claimed in claim 4, where R4 is selected from fluorinated or partly fluorinated alkyl.

15. The semiconductive component as claimed in claim 6, wherein the component comprises a solar cell, an OFET or a photodetector.

* * * * *